United States Patent
Cho

(10) Patent No.: US 7,751,261 B2
(45) Date of Patent: Jul. 6, 2010

(54) METHOD AND APPARATUS FOR CONTROLLING READ LATENCY OF HIGH-SPEED DRAM

(75) Inventor: Yong-ho Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 205 days.

(21) Appl. No.: 12/010,700

(22) Filed: Jan. 29, 2008

(65) Prior Publication Data

US 2008/0192563 A1 Aug. 14, 2008

(30) Foreign Application Priority Data

Feb. 8, 2007 (KR) ...................... 10-2007-0013339

(51) Int. Cl.
*G11C 7/00* (2006.01)
(52) U.S. Cl. ............... 365/194; 365/233.17; 365/233.1; 365/233.11; 365/233.12
(58) Field of Classification Search ................. 365/194, 365/233.17, 233.1, 233.11, 233.12
See application file for complete search history.

(56) References Cited

U.S. PATENT DOCUMENTS

2001/0015666 A1* 8/2001 Noda et al. ................. 365/233
2006/0022729 A1* 2/2006 Carley et al. ................ 327/164
2008/0144423 A1* 6/2008 Kwak ........................ 365/233.1

FOREIGN PATENT DOCUMENTS

| JP | 2000-100161 | 4/2000 |
|---|---|---|
| KR | 10-0184479 | 12/1998 |
| KR | 10-2006-0062426 | 6/2006 |

* cited by examiner

*Primary Examiner*—Thong Q Le
(74) *Attorney, Agent, or Firm*—Harness, Dickey & Pierce, P.L.C.

(57) ABSTRACT

Provided are a method and apparatus for controlling a read latency of a high-speed DRAM. A memory device may include a delay measurement unit, a delay locked loop, a latency counter and a data output buffer. The delay measurement unit measures a delay time between when an external clock signal is input and when read data is output to generate measurement signals and generates a first internal clock signal delayed from the external clock signal. The delay locked loop (DLL) receives the first internal clock signal and generates a second internal clock signal synchronized with the external clock signal. The latency counter generates a latency signal from an external read command signal in response to the measurement signals, and the data output buffer outputs the read data in response to the latency signal and the second internal clock signal.

28 Claims, 10 Drawing Sheets

METHOD AND APPARATUS FOR CONTROLLING READ LATENCY OF HIGH-SPEED DRAM

PRIORITY STATEMENT

This application claims the benefit of Korean Patent Application No. 10-2007-0013339, filed on Feb. 8, 2007, in the Korean Intellectual Property Office, the entire disclosure of which is incorporated herein by reference.

BACKGROUND

1. Field of the Invention

Example embodiments relate to a semiconductor memory device, and more particularly, to a method and apparatus for controlling a read latency of a DRAM (Dynamic Random Access Memory).

2. Description of the Related Art

A typical DRAM system has an external memory controller for processing a read request and/or a write request. The memory controller expects effective data to be loaded on a data bus after a number of external system clock cycles from a read request. The number of external system clock cycles may be predetermined. For example, the number of external system clock cycles may be seven. In a conventional DRAM system, the number of external system clock cycles corresponds to a read latency, which may be predetermined. The conventional DRAM typically has a clock system that receives an external clock signal. The conventional DRAM may generate internal clock signals from the external clock signal, and the internal clock signals may be used for one or more internal operations. A well-known internal clock system implemented in a DRAM is a back-timed read clock domain provided by a delay locked loop (DLL). The back-timed read clock domain provides a read clock signal. The read clock signal has a desired and/or predetermined phase relationship with an external system clock signal and is supplied to read latches. The back-timed read clock domain compensates for delay components on a data output path in order to provide read clock signals acting on output data latches to obtain a prescribed phase alignment with the external system clock signal.

FIG. 1 is a block diagram of a conventional memory device 100 and is used herein for explaining a read latency control operation of the conventional memory device 100. Referring to FIG. 1, the memory device 100 includes a command buffer 110 receiving an external command CMD and a clock buffer 120 receiving an external clock signal EXCLK. The external clock signal EXCLK buffered by the clock buffer 120 is applied to a DLL 130 to generate an internal clock signal DLLCLK of the memory device 100. The conventional memory device 100 controls a read latency in response to a read command PREAD. The read command PREAD output from the command buffer 110 is applied to a latency counter 140. The latency counter 140 samples the read command PREAD in response to the internal clock signal DLLCLK and an output clock signal of a replica delay unit 150. Based on the read command PREAD, the internal clock signal DLLCLK, and an output signal of the replica delay unit 150, the latency counter generates a latency signal LATENCY.

The replica delay unit 150 generates an internal clock signal delayed from the internal clock signal DLLCLK by a summed delay time tSAC+tREAD corresponding to the sum of a first delay time tSAC from when the internal clock signal DLLCLK is generated to when output data DOUT is output and a second delay time tREAD required for a read command to synchronize with the external clock signal EXCLK to be transmitted to the latency counter 140. The replica delay unit 150 is a replica of circuits on a first path tSAC and circuits on a second path tREAD. The DLL 130 delays the external clock signal EXCLK such that the internal clock signal DLLCLK leads the external clock signal EXCLK by the first delay tSAC.

The internal clock signal DLLCLK is applied to a delay compensator 160 and a clock signal, which is delayed from the internal clock signal DLLCLK by a delay time of the latency counter 140, is output from the delay compensator 160. A data output buffer 170 outputs the output data DOUT in response to the latency signal LATENCY and the clock signal output from the delay compensator 160.

FIG. 2A is a circuit diagram of a conventional latency counter 140a, which may be used as the latency counter 140 of FIG. 1 and a conventional replica delay unit 150. FIG. 2B is a timing diagram of the operation of the conventional latency counter 140a illustrated in FIG. 2A. Referring to FIG. 2A, the latency counter 140a is configured in the form of a shift register including first through fifth flip-flops 210, 212, 214, 216 and 218. The number of flip-flops depends on a CAS latency CL. The replica delay unit 150 includes first, second, third and fourth unit delays 202, 204, 206 and 208. The total delay time of the first, second, third and fourth unit delays 202, 204, 206 and 208 corresponds to tSAC+tREAD. A delay time tD of each of the first, second, third and fourth unit delays 202, 204, 206 and 208 corresponds to (tSAC+tREAD)/(CL−1).

In the replica delay unit 150, the internal clock signal DLLCLK is input to the first unit delay 202. First, second, third and fourth unit delays 202, 204, 206 and 208 are connected in series and the fourth unit delay 208 generates a clock signal P1 delayed from the internal clock signal DLLCLK by tSAC+tREAD, as illustrated in FIG. 2B. In the latency counter 140a, the first through fifth flip-flops 210, 212, 214, 216 and 218 receive the buffered read command PREAD and generate the latency signal LATENCY in response to output clock signals P1 through P4 of the first, second, third and fourth unit delays 202, 204, 206 and 208 and the internal clock signal P5 (DLLCLK). The latency counter 140a samples the buffered read command PREAD in response to the output clock signal P1 of the fourth unit delay 208 and generates the latency signal LATENCY from the internal clock signal P5 (DLLCLK).

The latency counter 140a configured in the form of a shift register is advantageous when the number of CAS latencies that the latency counter 140a should support is small but disadvantageous for high-speed DRAMs having a large number of CAS latencies that the latency counter 140a should support. This is at least in part because a delay chain such as the latency counter 140a must be additionally required according to CAS latency and thus, the number of delay chains increases when the number of CAS latencies increases. This requires delay time tuning in consideration of a process variation, a voltage variation and a temperature variation and increasing the number of delay chains increase a layout area of a DRAM. Furthermore, a minimum access time tAA of a DRAM is increased when the number of CAS latencies increases because of a timing margin that must be secured for each of the first through fifth flip-flops 210, 212, 214, 216 and 218, and thus the limit of the data access speed of the DRAM is determined by the latency counter rather than a speed of reading data from a memory cell.

To address and/or solve issues of the shift register type latency counter 140a, a conventional pointer type latency counter 140b as illustrated in FIG. 3A has been proposed.

Referring to FIG. 3A, the conventional latency counter 140b includes two ring counters 310 and 320. The number of bits of the ring counters 310 and 320 is determined by CL. The first ring counter 310 receives an internal clock signal DLLCLK and generates a clock pulse signal TCLK<i> (i=0 through 5). The second ring counter 320 receives an internal clock signal delayed from the internal clock signal DLLCLK by tSAC+tREAD through the replica delay unit 150 and generates a clock pulse signal SCLK<i> (i=0 through 5). A delay time from when the clock pulse signal TCLK<i> is generated until when the clock pulse signal SCLK<i> is generated becomes tSAC+tREAD, and a delay time from when the clock pulse signal SCLK<i> is generated until when the clock pulse signal TCLK<i> is generated becomes N*tCK−(tSAC+tREAD). N is the number of bits of a ring counter and is generally determined by CL.

Still referring to FIG. 3A, first switches 330 sample the buffered read command PREAD in response to the pulse signal SCLK<i> and transfer the sampled read command to a register 340. Second switches 350 sample the read command PREAD stored in the register 340 in response to the pulse signal SCLK<i> to generate the latency signal LATENCY. The read command PREAD is delayed by N*tCK in the latency counter 140b when the delay time from when the internal clock signal DLLCLK is generated until when the output data DOUT is output and the delay time tREAD required for a read command synchronized with the external clock signal EXCLK to be transmitted to the latency counter 140 are considered. An example timing diagram of the operation of the conventional latency counter 140b is illustrated in FIG. 3B. In the example of FIG. 3B, the CL is six. The latency signal LATENCY is generated in synchronization with the internal clock signal DLLCLK.

The pointer type latency counter 140b does not bring about a variation in the minimum access time tAA of the DRAM even when CL is increased because the sampled read command is not shifted. However, the latency counter 140b has to maintain the delay time tSAC+tREAD between the clock pulse signal TCLK<i> and the clock pulse signal SCLK<i> for a normal latency control operation, and thus a glitch clock signal must be prevented from being input to the latency counter 140b. Furthermore, the latency counter 140b additionally requires a latency clock initialization circuit, and thus the delay time of the second ring counter 310 generating the clock pulse signals TCLK<i> is added to increase the delay time tSAC. Moreover, if the DLL 120 (illustrated in FIG. 1) cannot be powered off without using a glitch clock signal in a power down mode of a DRAM, power consumption in the power down mode is increased.

SUMMARY

Example embodiments provide a memory device for controlling a correct read latency.

Example embodiments also provide a method of controlling a read latency of a memory device.

An example embodiment provides a memory device. The memory device may include a delay measurement unit measuring a delay time between when an external clock signal is input and when read data is output to generate measurement signals and generating a first internal clock signal delayed from the external clock signal, a delay locked loop (DLL) receiving the first internal clock signal and generating a second internal clock signal synchronized with the external clock signal, a latency counter generating a latency signal from an external read command signal in response to the measurement signals, and a data output buffer outputting the read data in response to the latency signal and the second internal clock signal.

According to an example embodiment, the delay measurement unit may generate the first internal clock signal having a one-cycle-missed period in response to a locking completion signal representing a time when locking of the DLL is finished.

According to an example embodiment, the delay measurement unit may include a measurement start signal generator generating a measurement start signal in response to the locking completion signal and the external clock signal and generating the first internal clock signal in response to the measurement start signal and the external clock signal, a measurement control signal generator generating first and second measurement control signals in response to the external clock signal and the locking completion signal, a frequency divider dividing the frequency of the external clock signal in response to the first measurement control signal to generate a frequency divided clock signal, a control clock generator generating a control clock signal in response to the second measurement control signal and the external clock signal, and a measurement signal generator generating the measurement signals and a measurement stop signal in response to the control clock signal and the frequency divided clock signal.

According to an example embodiment, the DLL may include a phase detector comparing the phase of the external clock signal to the phase of the second internal clock signal and generating a phase control signal, and a delay delaying the first internal clock signal in response to the phase control signal to generate the second internal clock signal.

According to an example embodiment, the latency counter may include a logic circuit combining the measurement signals and latency information of the memory device to generate a plurality of switch signals, a plurality of flip-flops connected in series and sequentially receiving the external read command signal in response to the external clock signal, and a switching unit selecting the external read command signal or the output signals of the flip-flops in response to the switch signals and transferring the selected signal as the latency signal.

Another example embodiment provides a memory device. The memory device may include a command buffer receiving an external command and outputting a first command signal, a clock buffer receiving an external clock signal and generating a first internal clock signal, a delay measurement unit generating a second internal clock signal and measurement signals in response to the first internal clock signal and a fourth internal clock signal in order to measure a delay time between when the external clock signal is input and when read data is output, a DLL receiving the second internal clock signal and generating a third internal clock signal and the fourth internal clock signal synchronized with the first internal clock signal, a latency counter generating a second command signal from the first command signal in response to the first internal clock signal and the measurement signals, a delay cell replica delaying the second command signal by a delay time from the second internal clock signal to the third internal clock signal to generate a latency signal, and a data output buffer outputting the read data in response to the latency signal and the third internal clock signal.

Still another example embodiment provides a method of operating a memory device. The method may include generating an internal clock signal from an external clock signal input to a DLL; generating measurement signals using the internal clock signal that misses one clock-cycle in order to measure a delay time from when the external clock signal is input until when data read from a memory array is output; generating a latency signal from an external read command signal in response to the measurement signals; and outputting the read data in response to the latency signal and the internal clock signal.

According to an example embodiment, the internal clock signal may lead the external clock signal by a delay time from when the internal clock signal is generated until when the read data is output.

According to an example embodiment, the generating of the measurement signals may include generating a measurement start signal having a logic low period corresponding to one clock cycle in response to a locking completion signal representing a time when locking of the DLL is finished; generating the internal clock signal in response to the external clock signal and the measurement start signal; dividing the frequency of the internal clock signal to generate a frequency divided clock signal; and sampling the frequency divided clock signal in response to the internal clock signal and generating the measurement signals.

According to an example embodiment, the generating of the latency signal may include combining the external read command signal with latency information of the memory device to generate a plurality of switch signals; inputting the external read command signal to a shift register including and/or consisting of a plurality of flip-flops connected in series; and outputting the output signals of the flip-flops, which correspond to the switch signals, as the latency signal in response to the external clock signal.

According to an example embodiment, the latency signal may be enabled after a lapse of a number of clock cycles, which is smaller than the CAS latency of the memory device by 1, in order to generate a data strobe signal of the memory device. The latency signal may be enabled during a period in which data corresponding to the burst length of the memory device is output.

Example embodiment may not require delay tuning according to a PVT (Process, Voltage and Temperature) variation because a delay time variation in the delay cells of the DLL due to the PVT variation is reflected in a delay cell replica to generate a latency signal. Furthermore, a glitch clock signal is prevented from being generated from a DLL even when the DLL is powered off in a power down mode of the memory device according to an example embodiment. According, a latency clock initialization circuit is not needed and the DLL can be freely powered on and off according to an example embodiment.

BRIEF DESCRIPTION OF THE DRAWINGS

The above and other features and advantages of example embodiments will become more apparent by reviewing the following detailed description of example embodiments of this disclosure with reference to the attached drawings in which.

DETAILED DESCRIPTION OF EXAMPLE EMBODIMENTS

Figure 1:
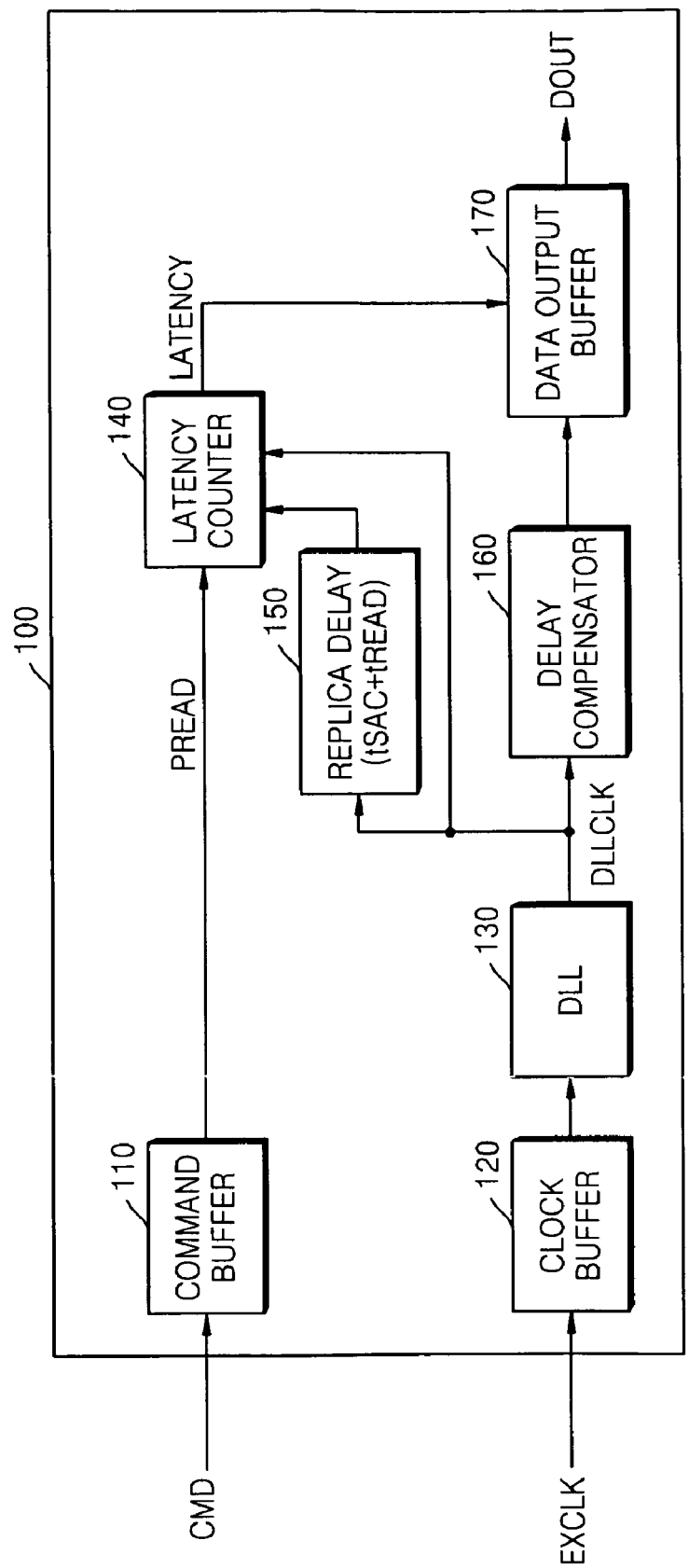
FIG. 1 is a block diagram of a conventional memory device used herein for explaining an operation of controlling a read latency of the conventional memory device.
Figure 2A:
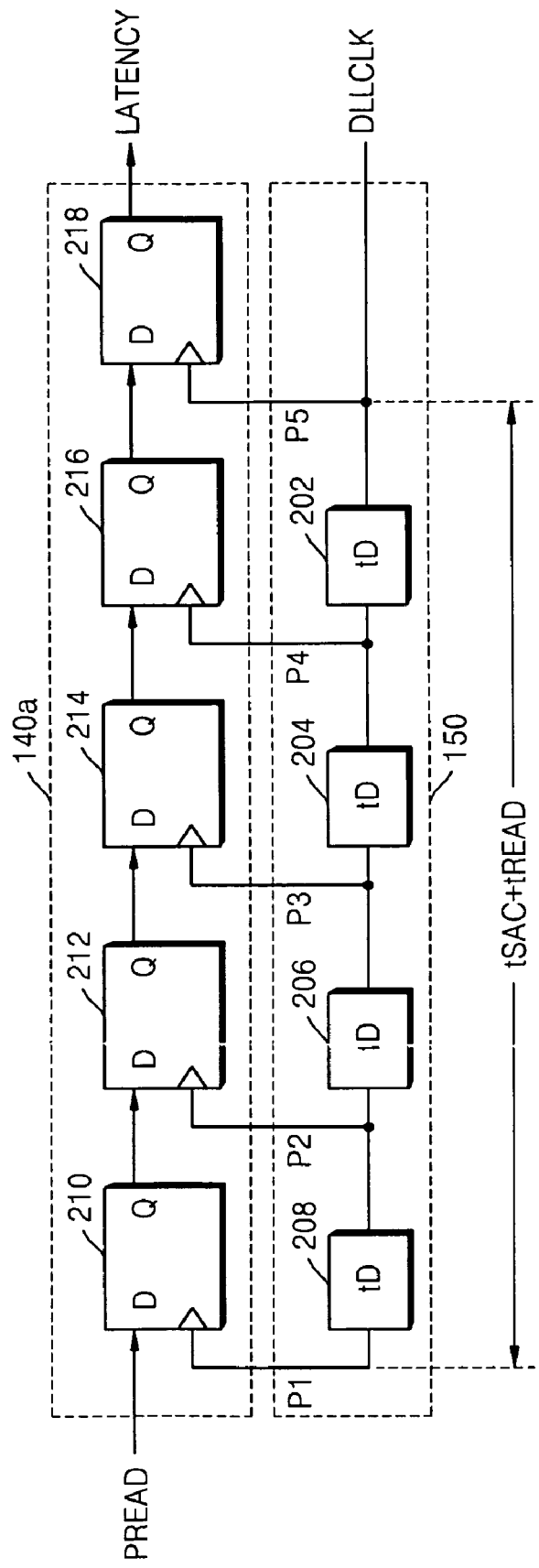
FIG. 2A is a circuit diagram of a conventional shift register type latency counter, which may be used in the memory device illustrated in FIG. 1.
Figure 2B:
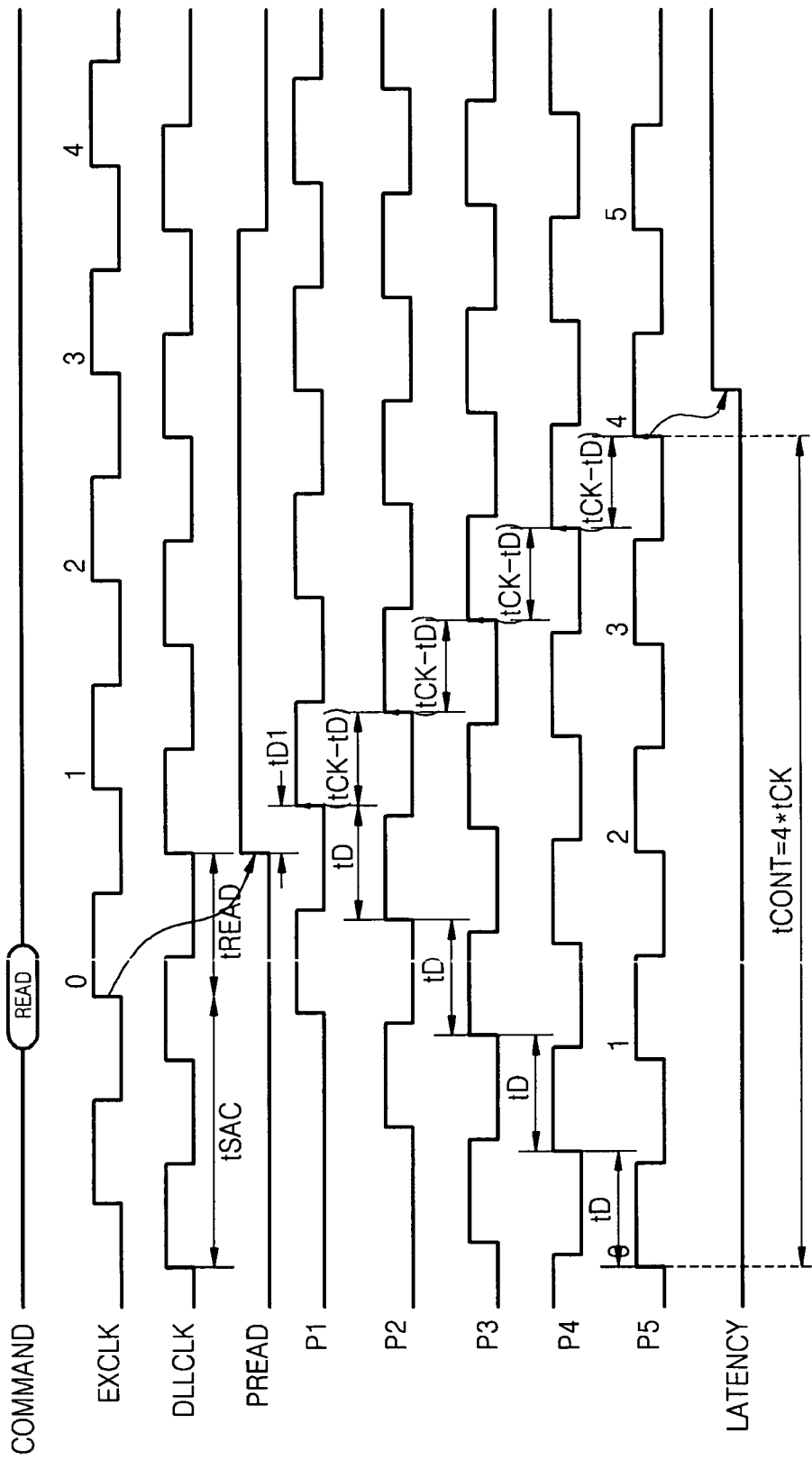
FIG. 2B is a timing diagram of the conventional operation of the latency counter illustrated in FIG. 2A.
Figure 3A:
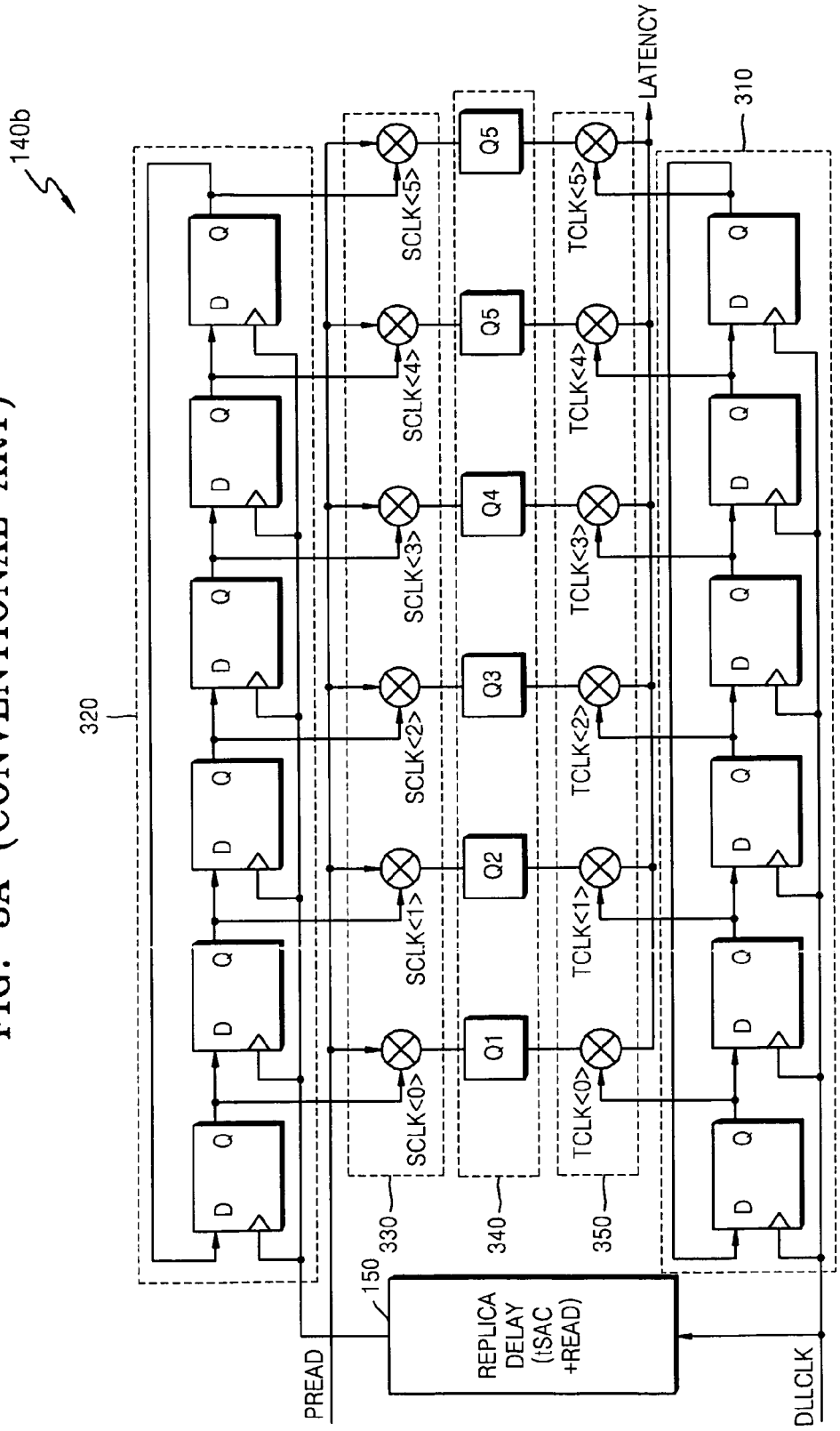
FIG. 3A is a circuit diagram of another conventional pointer type latency counter, which may be used in the memory device illustrated in FIG. 1.
Figure 3B:
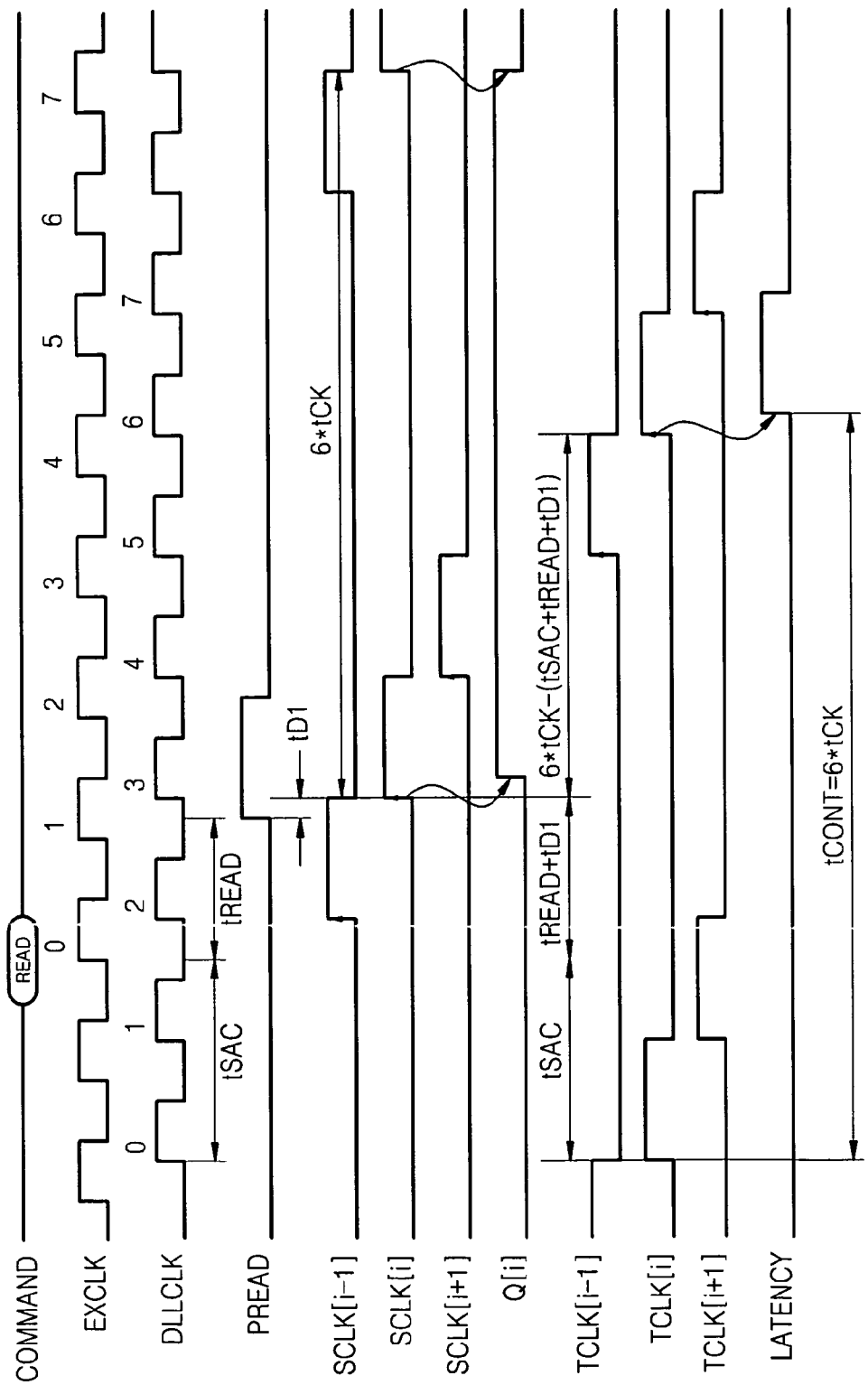
FIG. 3B is a timing diagram of the conventional operation of the latency counter illustrated in FIG. 3A.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of example embodiments to those skilled in the art. In the drawings, like numbers refer to like elements throughout. Further, the thicknesses of layers and regions are exaggerated for clarity in the drawings.

Figure 4:
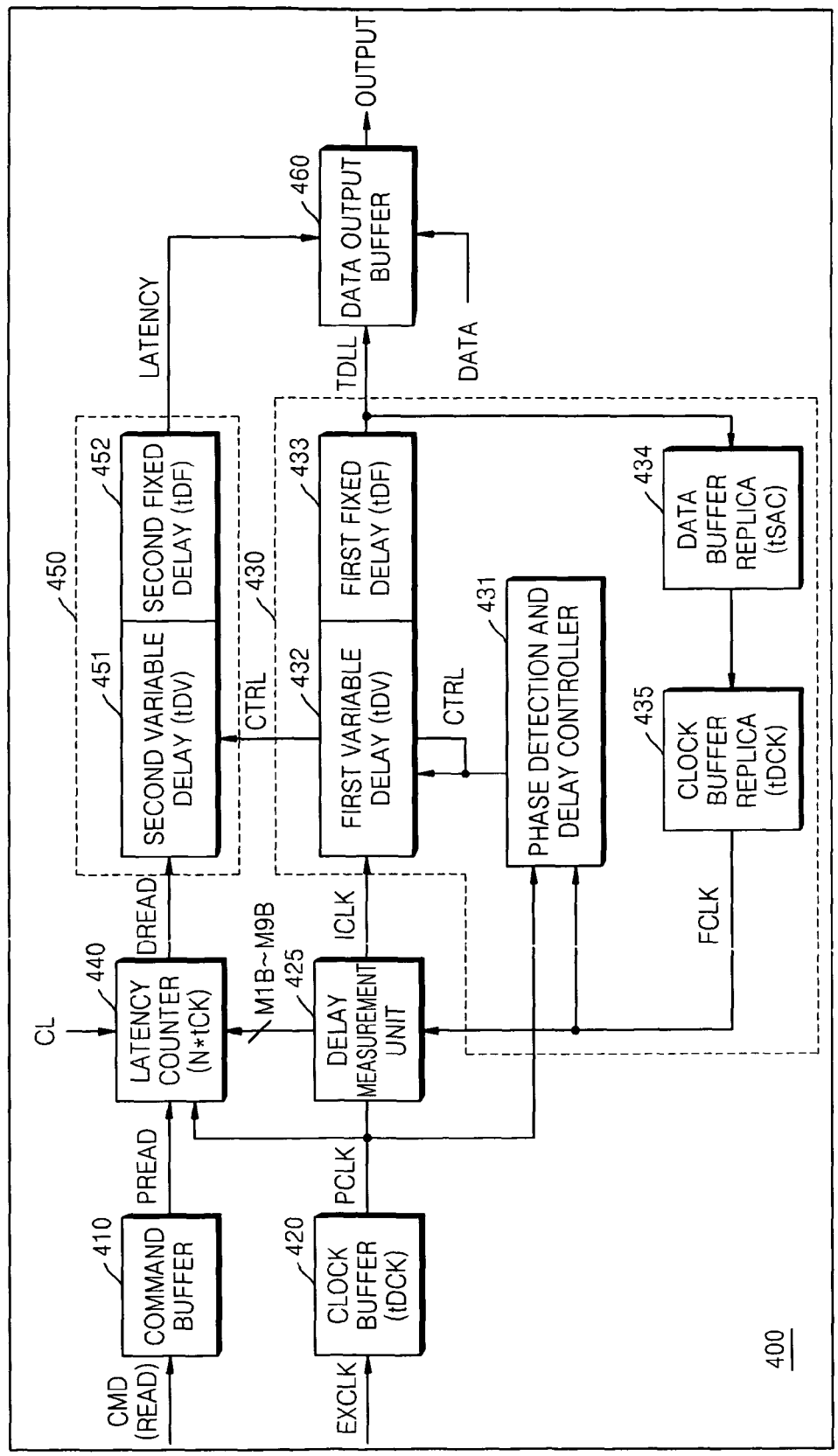
FIG. 4 is a block diagram of an example embodiment of a memory device using a read latency control method according to an example embodiment.

FIG. 4 is a block diagram of an example embodiment of a memory device 400 using a read latency control method according to an example embodiment. Referring to FIG. 4, the memory device 400 includes a command buffer 410, a clock buffer 420, a delay measurement unit 425, a DLL 430, a latency counter 440, a delay cell replica 450, and a data output buffer 460.

The command buffer 410 may receive an external command CMD, for example, a read command READ, and output a first read signal PREAD based on the external command CMD. The clock buffer 420 may receive an external clock signal EXCLK and output a first internal clock signal PCLK after a lapse of delay time tDCK.

The delay measurement unit 425 may measure a delay time between the input of the external clock signal EXCLK and the output of output data OUTPUT. The delay measurement unit 425 may generate a second internal clock signal ICLK and measurement signals M1B through M9B in response to the first internal clock signal PCLK and a fourth internal clock signal FCLK output from the DLL 430, which will be described in greater detail below. The delay measurement unit 425 will be explained later in more detail with reference to FIG. 6.

Still referring to FIG. 4, the DLL 430 includes a phase detection and delay controller 431, a first variable delay 432, a first fixed delay 433, a data output buffer replica 434, and a clock buffer replica 435.

The phase detection and delay controller 431 may compare the phase of the first internal clock signal PCLK to the phase of the fourth internal clock signal FCLK. Based on the comparison, the phase detection and delay controller 431 may generate a phase control signal CTRL. The first variable delay 432 may receive the second internal clock signal ICLK and variably delay the phase of the second internal clock signal ICLK based on the phase control signal CTRL. The first fixed delay 433 delays the output signal of the first variable delay 432 by a fixed time to generate a third internal clock signal TDLL. The third internal clock signal TDLL may sequentially pass through the data output buffer replica 434, which may have the same configuration as the data output buffer 460, and the clock buffer replica 435, which may have the same configuration as the clock buffer 420, and is output as the fourth internal clock signal FCLK.

The latency counter 440 may receive the first read signal PREAD and generate a second read signal DREAD in response to the first internal clock signal PCLK and the measurement signals M1B through M9B output from the delay measurement unit 425. The latency counter 440 may determine the number of clock cycles tCK during which the first read signal PREAD should be maintained.

The delay cell replica 450 may receive the second read signal DREAD and generate a latency signal LATENCY. The delay cell replica 450 includes a second variable delay 451 and a second fixed delay 425. The second variable delay 451 may have the same configuration and delay time tDV as the first variable delay 432 of the DLL 430. Similarly, the second fixed delay 452 may have the same configuration and delay time tDF as the first fixed delay 433 of the DLL 430. Accordingly, a path through which the second read signal DREAD is generated as the latency signal LATENCY is identical to a path through which the second internal clock signal ICLK is generated as the third internal clock signal TDLL. The data output buffer 460 may output read data DATA of the memory device 400 as output data OUTPUT in response to the latency signal LATENCY and the third internal clock signal TDLL.

Figure 5:
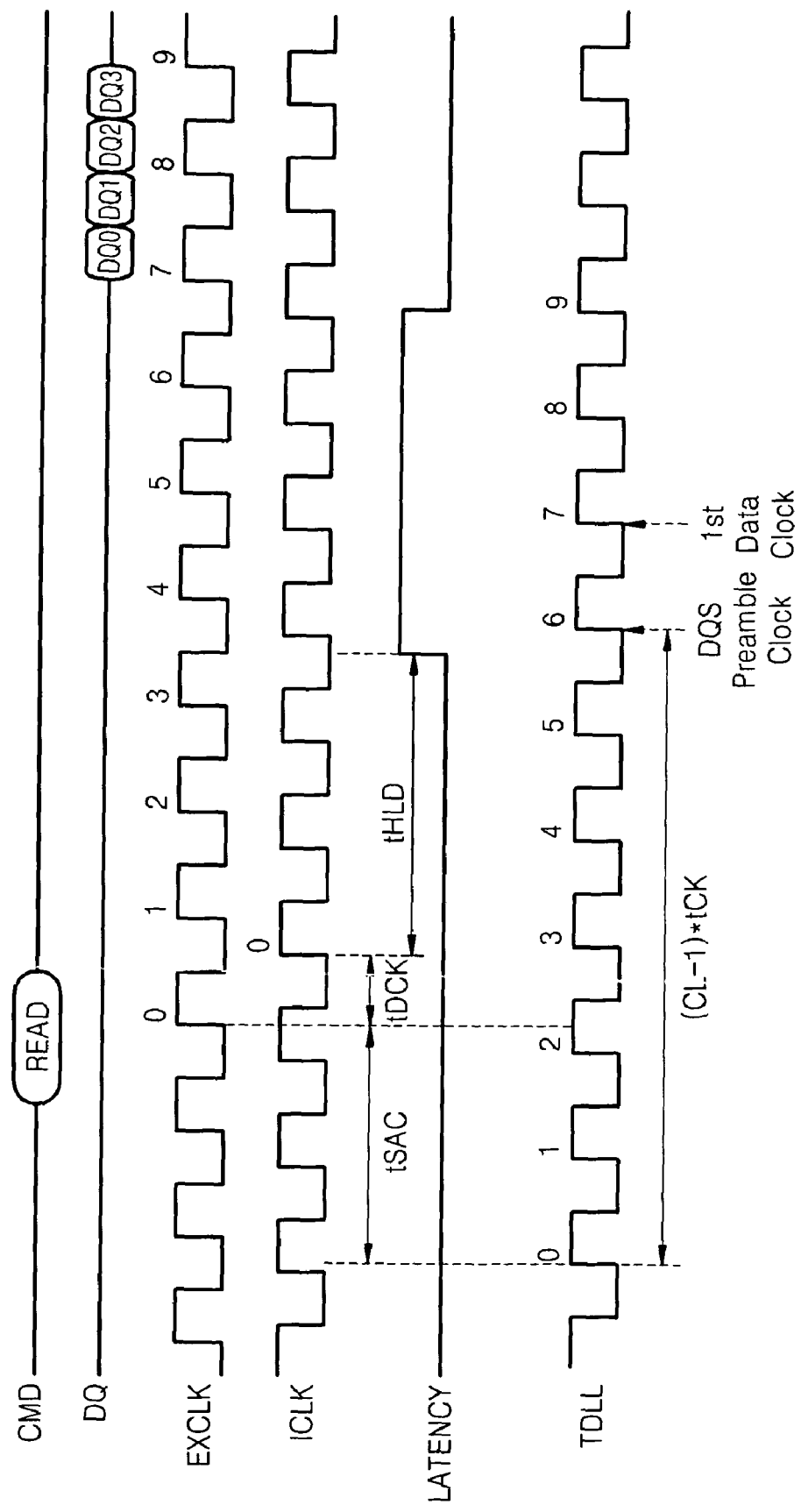
FIG. 5 is an example timing diagram of the operation of an example embodiment of memory device illustrated in FIG. 4.

FIG. 5 is an example timing diagram of the operation of the memory device 400 illustrated in FIG. 4 according to an example embodiment. Referring to FIG. 5, when CL is 7, output data bits DQ0, DQ1, DQ2 and DQ3 are output after 7 clock cycles from when the read command READ synchronized with the external clock signal EXCLK is input. To achieve this, the third internal clock signal TDLL output from the DLL 430 is generated that leads the external clock signal EXCLK by a delay time tSAC. The second internal clock signal ICLK is generated from the third internal clock signal TDLL after the lapse of the delay time tSAC of the data output buffer replica 434 and the delay time tDCK of the clock buffer replica 435. The latency signal LATENCY is generated from the second internal clock signal ICLK after the lapse of a delay time tHLD of the delay cell replica 450. The delay time tHLD corresponds to the sum of the delay time tDV of the second variable delay 451 and the delay time tDF of the second fixed delay 452. In FIG. 5, the latency signal LATENCY is enabled to logic high before the sixth clock pulse of the third internal clock signal TDLL in order to generate a data strobe signal DQS and is maintained in the enabled state during a period in which data corresponding to the burst length BL of an example embodiment of the memory device 400 is output. The burst length BL is equal to four in the example of FIG. 5.

Figure 6:
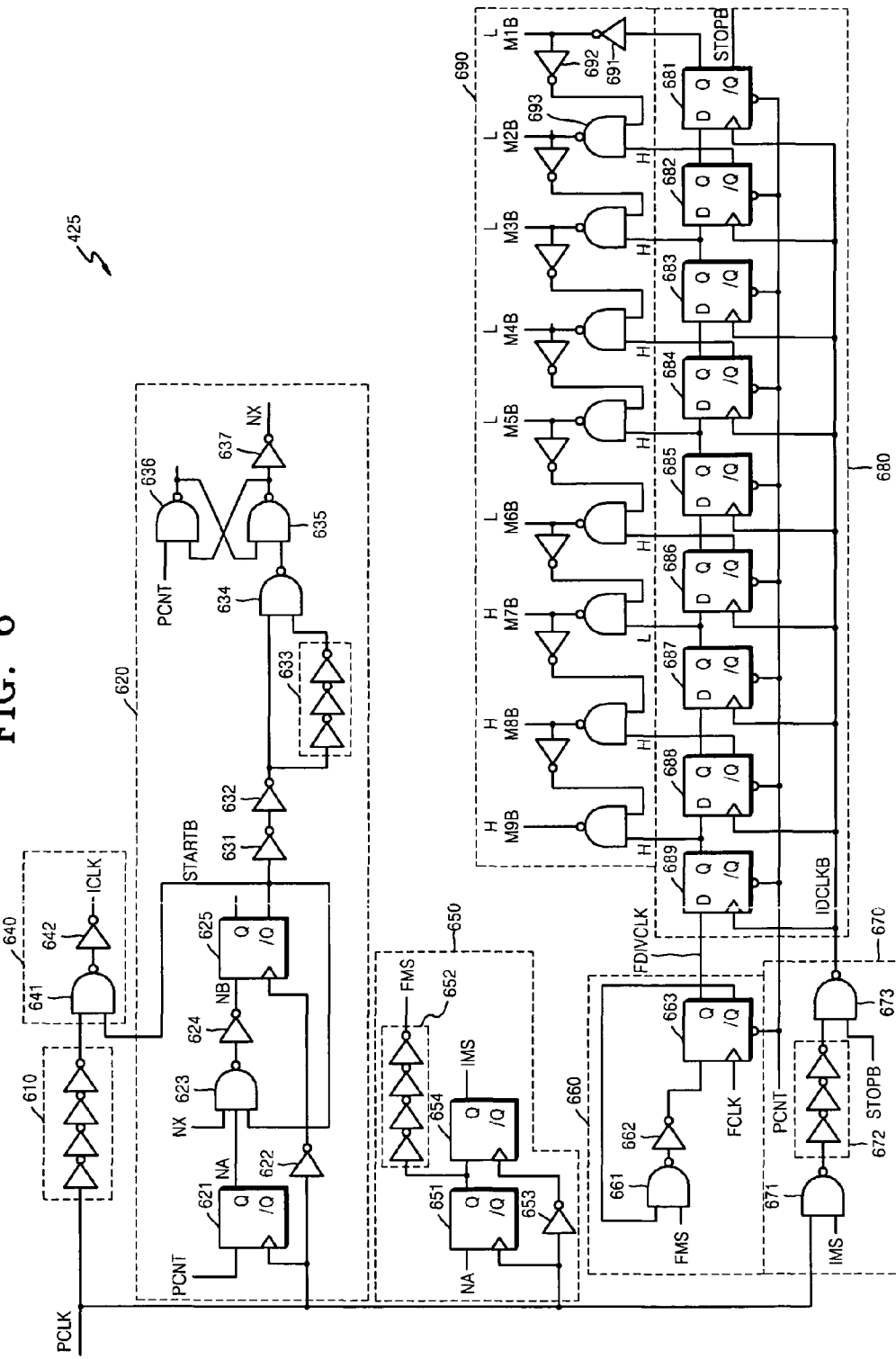
FIG. 6 is a circuit diagram of an example embodiment of a delay measurement unit illustrated in FIG. 4.
Figure 7:
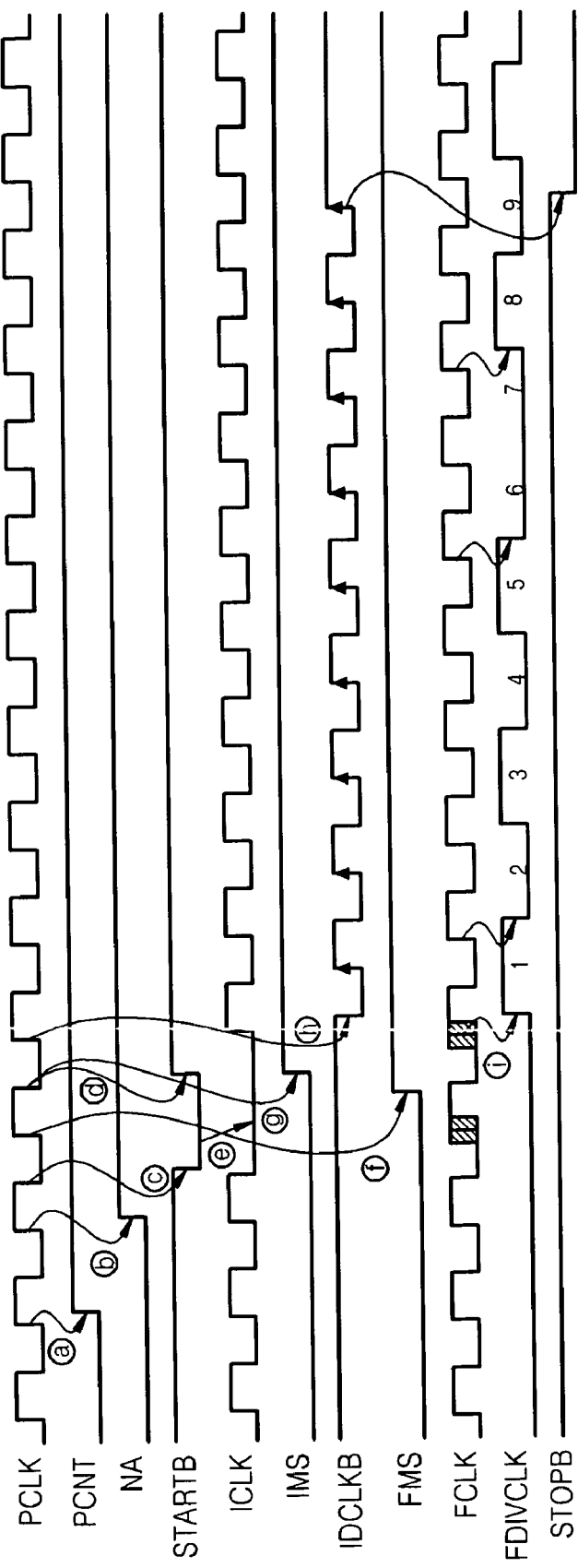
FIG. 7 is an example timing diagram of the operation of an example embodiment of the delay measurement unit illustrated in FIG. 4.

FIG. 6 is a circuit diagram of an example embodiment of a delay measurement unit 425 illustrated in FIG. 4, and FIG. 7 is an example timing diagram of the operation of the delay measurement unit 425 illustrated in FIG. 4. Referring to FIG. 6, the delay measurement unit 425 includes a latency counter replica 610, a measurement start signal generator 620, a second internal clock signal generator 640, a measurement control signal generator 650, a frequency divider 660, a control clock signal generator 670, a shift register 680, and a measurement signal generator 690. The delay measurement unit 425 may, for example, measure a delay time of maximum 9*tCK using nine flip-flops 681 through 689 included in the shift register 680.

The latency counter replica 610 may receive the first internal clock signal PCLK and delay the first internal clock signal PCLK by a delay time of the latency counter (440 illustrated in FIG. 4). The latency counter replica 610 has the same configuration as the latency counter 440 illustrated in FIG. 4 according to an example embodiment.

The measurement start signal generator 620 may generate a measurement start signal STARTB in response to a locking completion signal PCNT. The locking completion signal PCNT may represent the completion of a locking operation of the DLL 430 illustrated in FIG. 4 and the first internal clock signal PCLK. The measurement start signal generator 620 includes a first flip-flop 621i receiving the locking completion signal PCNT in response to the first internal clock signal PCLK and outputting a first node signal NA; a first inverter 622 receiving the first internal clock signal PCLK; a first NAND gate 623 receiving the first node signal NA, a third node signal NX and the measurement start signal STARTB; a second inverter 624 receiving the output signal of the first NAND gate 623 and outputting a second node signal NB; and a second flip-flop 625 receiving the second node signal NB in response to the output signal of the first inverter 622 and outputting the measurement start signal STARTB. In addition, the measurement start signal generator 620 of FIG. 6 further includes a third inverter 631 receiving the measurement start signal STARTB; a fourth inverter 632 receiving the output signal of the third inverter 631; a delay 633 delaying and inverting the output signal of the fourth inverter 632; a second NAND gate 634 receiving the output signal of the fourth inverter 632 and the output signal of the delay 633; a third NAND gate 635 receiving the output signal of the second NAND gate 634 and the output signal of a fourth NAND gate 636; the fourth NAND gate 636 receiving the locking completion signal PCNT and the output signal of the third NAND gate 635; and a third inverter 637 receiving the output signal of the third NAND gate 635 and generating the third node signal NX.

The second internal clock signal generator 640 of FIG. 6 includes a NAND gate 641 receiving the first internal clock signal that has passed through the latency counter replica 610 and the measurement start signal, and an inverter 642 receiving the output signal of the NAND gate 641 and outputting the second internal clock signal ICLK.

The measurement control signal generator 650 of FIG. 6 includes a first flip-flop 651 receiving the first node signal NA in response to the first internal clock signal PCLK, a delay 652 receiving the output signal of the first flip-flop 651 and outputting a first measurement control signal FMS, an inverter 653 receiving the first internal clock signal PCLK, and a second flip-flop 654 receiving the output signal of the first flip-flop 651 in response to the output signal of the inverter 653 and outputting a second measurement control signal IMS.

The frequency divider 660 of FIG. 6 includes a NAND gate 661 receiving the first measurement control signal FMS and an inverted output signal /Q of a flip-flop 663; an inverter 662 receiving the output signal of the NAND gate 661; and the flip-flop 663 that is reset when the locking completion signal PCNT is disabled, receives the output signal of the inverter 662 in response to the fourth internal clock signal FCLK, and generates a frequency divided clock signal FDIVCLK.

The control clock generator 670 of FIG. 6 includes a first NAND gate 671 receiving the first internal clock signal PCLK and the second measurement control signal IMS; a delay 672 receiving, inverting, and delaying the output signal of the first NAND gate 671; and a second NAND gate 673 receiving the output signal of the delay 672 and a measurement stop signal STOPB, and generating a control clock signal IDCLKB.

The shift register 680 of FIG. 6 includes a plurality of flip-flops 681 through 689 connected in series and receives the frequency divided clock signal FDIVCLK in response to the control clock signal IDCLKB. The flip-flops 681 through 689 are reset when the locking completion signal PCNT is disabled. The flip-flop 689 receives the frequency divided clock signal FDIVCLK in response to the control clock signal IDCLKB and then outputs the frequency divided clock signal FDIVCLK. The flip-flop 688 receives the output of the flip-flop 689 in response to the control clock signal IDCLKB and then outputs the received signal. In this manner, the flip-flops 687 through 681 respectively receive the output signals of the directly prior flip-flops of the series in response to the control clock signal IDCLKB and then output the received signals. The inverted output signal of the flip-flop 681 is output as the measurement stop signal STOPB.

The measurement signal generator 690 of FIG. 6 outputs measurement signals M2B through M8B respectively in response to the inverted output signals of the flip-flops 682 through 688 and the measurement signals M1B through M7B. A first measurement signal M1B is generated by a first inverter 691 inverting the output of the flip-flop 681. The second measurement signal M2B is generated by a NAND gate 693 receiving the output of a second inverter 692 inverting the first measurement signal M1B and the inverted output signal /Q of the flip-flop 682. The third, fifth, seventh and ninth measurement signals M3B, M5B, M7B and M9B are respectively generated by performing a logic NAND operation on the inverted signals of the second, fourth, sixth and eighth measurement signals M2B, M4B, M6B and M8B and the output signals Q of the flip-flops 683, 685, 687 and 689. The fourth, sixth and eighth measurement signals M4B, M6B and M8B are respectively generated by carrying out a logic NAND operation on the inverted signals of the third, fifth and seventh measurement signals and the inverted output signals /Q of the flip-flops 684, 686 and 688.

An example operation of an example embodiment of a delay measurement unit 425 will now be explained with reference to the timing diagram of FIG. 7. Referring to FIG. 7, the locking completion signal PCNT of the DLL (e.g., 430 illustrated in FIG. 4) is generated in response to a rising edge of the first internal clock signal PCLK (ⓐ). The first node signal NA at logic high is generated in response to the next rising edge of the first internal clock signal PCLK (ⓑ), and the measurement start signal STARTB at logic low is generated in response to the following falling edge of the first internal clock signal PCLK (ⓒ) and then transitions to logic high in response to the next falling edge of the first internal clock signal PCLK (ⓓ). Accordingly, the measurement start signal STARTB has a logic low period corresponding to one clock cycle of the first internal clock signal PCLK in FIG. 7.

A logic AND operation may be performed on the first internal clock signal PCLK and the measurement start signal STARTB to generate the second internal clock signal ICLK (ⓔ) shown in FIG. 7. Thus, the second internal clock signal ICLK misses one clock cycle. There is no phase difference between the second internal clock signal ICLK and the third internal clock signal FCLK because the DLL (e.g., 430 illustrated in FIG. 4) is locked. After the first node signal NA transitions to logic high, the first measurement control signal FMS at logic high is generated in response to a rising edge of the first internal clock signal PCLK (ⓕ), and the second measurement control signal IMS at logic high is generated in response to the following falling edge of the first internal clock signal PCLK (ⓖ).

Still referring to FIG. 7, the control clock signal IDCLKB is generated having the inverted level of the first internal clock signal PCLK during a logic high period of the second measurement control signal IMS (ⓗ). The frequency divided clock signal FDIVCLK may be generated by dividing the third internal clock signal FCLK by two during a logic high period of the first measurement control signal FMS (ⓘ). In FIG. 7, the frequency divided clock signal FDIVCLK misses one pulse. The output signals Q of the flip-flops 681 through 689 of the shift register (680 illustrated in FIG. 6) become H-H-H-H-H-H-L-H-H (H represents logic high and L represents logic low) in response to rising edges of the control clock signal IDCLKB. Accordingly, the first through ninth measurement signals M1B through M9B become L-L-L-L-L-L-H-H-H. When the one-pulse-missed period of the frequency divided clock signal FDIVCLK is input to the flip-flop 681, the measurement stop signal STOPB at logic low is generated.

Figure 8:
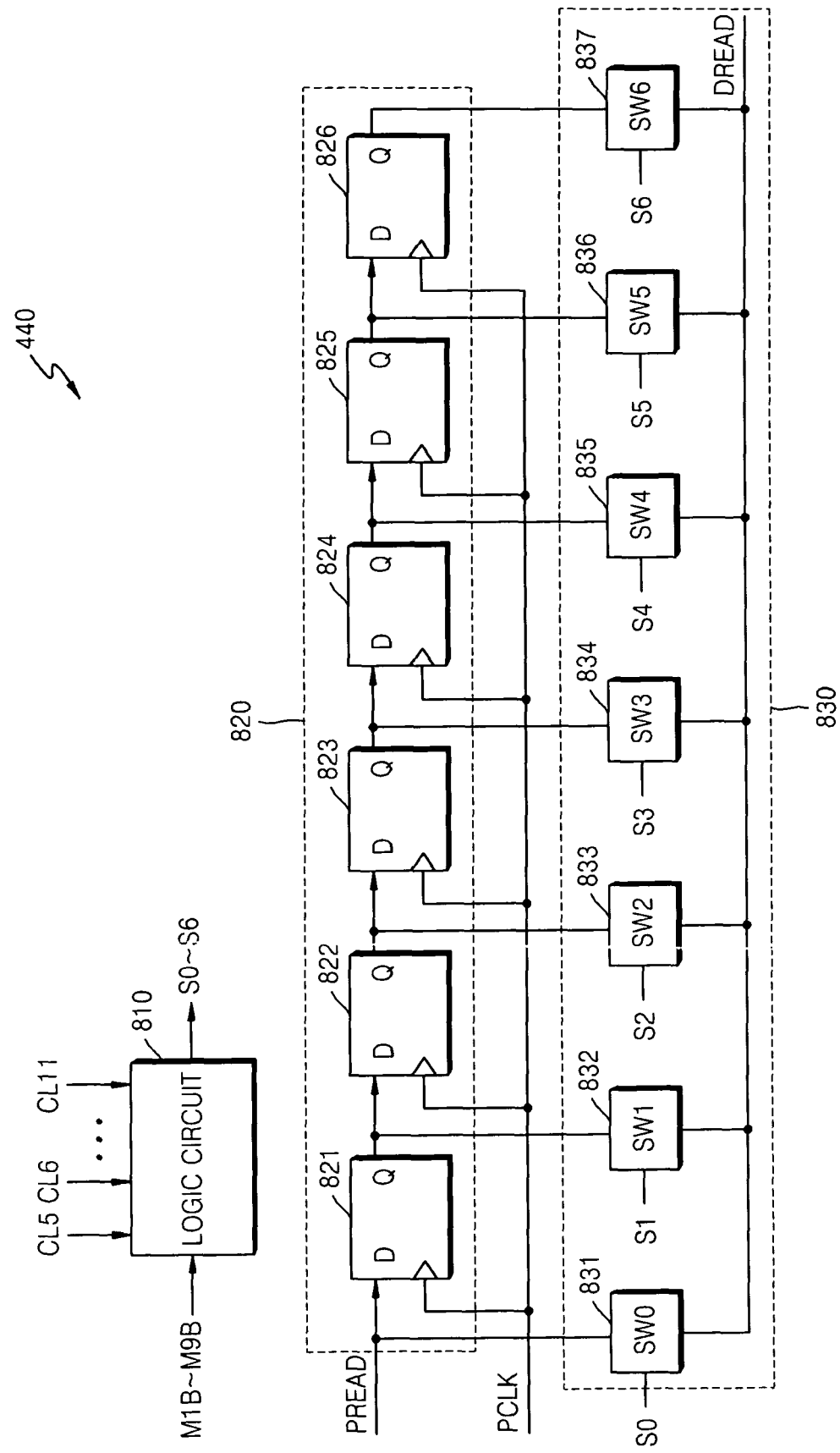
FIG. 8 is a circuit diagram of an example embodiment of a latency counter illustrated in FIG. 4.

FIG. 8 is a circuit diagram of an example embodiment of the latency counter 440 illustrated in an example embodiment of a memory device 400 in FIG. 4. Referring to FIG. 8, the latency counter 440 includes a logic circuit 810 that may combine the measurement signals M1B through M9B provided by the delay measurement unit 425 with latency information CL5 through CL11 to generate a plurality of switch signals S0 through S6. The latency counter 440 further includes a shift register 820 including a plurality of flip-flops 821 through 826, which may sequentially receive the first command signal PREAD in response to the first internal clock signal PCLK, and a switching unit 830, which may selectively transfer the first command signal PREAD and the output signals Q of the flip-flops 821 through 826 as the second command signal DREAD.

The timing margin of the flip-flops 821 through 826 of the latency counter 440 may correspond to the clock cycle tCK of the first internal clock signal PCLK. The number of flip-flops used and/or required for the latency counter 440 may be determined as an integer that does not exceed (CL*tCK-tSAC-tDCK-tDF-tDV)/tCK. Accordingly, the latency counter 440 can be controlled even during a minimum access time tAA of a memory device 400 according to an example embodiment.

Therefore, an example embodiment of a memory device 400 does not require delay tuning according to a PVT (Process, Voltage and Temperature) variation because a delay time variation in the delay cells 432 and 433 of the DLL 430 due to the PVT variation is reflected in the delay cell replica 450 to generate the latency signal LATENCY. Furthermore, a glitch clock signal is inhibited and/or prevented from being generated from the DLL 430 even when the DLL is powered off in a power down mode of a memory device according to an example embodiment. As such, a latency clock initialization circuit is not needed and the DLL can be freely powered on and off according to an example embodiment.

While example embodiments have been particularly shown and described above with reference to the drawings, it will be understood by those of ordinary skill in the art that various changes in form and details may be made therein without departing from the spirit and scope of this disclosure.

What is claimed is:

1. A memory device comprising:
    a delay measurement unit measuring a delay time between when an external clock signal is input and when read data is output to generate measurement signals, and generating a first internal clock signal delayed from the external clock signal;
    a delay locked loop (DLL) receiving the first internal clock signal and generating a second internal clock signal synchronized with the external clock signal;
    a latency counter generating a latency signal from an external read command signal in response to the measurement signals; and
    a data output buffer outputting the read data in response to the latency signal and the second internal clock signal,
        wherein the delay measurement unit generates the first internal clock signal having a one-cycle-missed period in response to a locking completion signal representing a time when locking of the DLL is finished.

2. The memory device of claim 1, wherein the delay measurement unit comprises:
    a measurement start signal generator generating a measurement start signal in response to the locking completion signal and the external clock signal, and generating the first internal clock signal in response to the measurement start signal and the external clock signal;
    a measurement control signal generator generating first and second measurement control signals in response to the external clock signal and the locking completion signal;
    a frequency divider dividing a frequency of the external clock signal in response to the first measurement control signal to generate a frequency divided clock signal;
    a control clock generator generating a control clock signal in response to the second measurement control signal and the external clock signal; and
    a measurement signal generator generating the measurement signals and a measurement stop signal in response to the control clock signal and the frequency divided clock signal.

3. The memory device of claim 2, wherein the measurement start signal generator comprises:
    a first flip-flop receiving the locking completion signal in response to the external clock signal and outputting a first node signal;
    a first inverter receiving the external clock signal;
    a first NAND gate receiving the first node signal, a third node signal and the measurement start signal;
    a second inverter receiving an output signal of the first NAND gate and outputting a second node signal;
    a second flip-flop receiving the second node signal in response to an output signal of the first inverter and outputting the measurement start signal;
    a delay delaying and inverting the measurement start signal;
    a second NAND gate receiving the measurement start signal and an output signal of the delay;
    a third NAND gate receiving an output signal of the second NAND gate and an output signal of a fourth NAND gate;
    the fourth NAND gate receiving an output signal of the third NAND gate and the external clock signal;
    a third inverter receiving the output signal of the third NAND gate and generating the third node signal;
    a latency counter replica receiving the external clock signal and delaying the external clock signal by a delay time of the latency counter; and
    an AND gate receiving an output signal of the latency counter replica and the measurement start signal and outputting the first internal clock signal.

4. The memory device of claim 3, wherein the measurement control signal generator comprises:
    a third flip-flop receiving the first node signal in response to the external clock signal;
    a second delay receiving an output signal of the third flip-flop and outputting the first measurement control signal;
    a fourth inverter receiving the external clock signal; and
    a fourth flip-flop receiving the output signal of the third flip-flop in response to an output signal of the fourth inverter and outputting the second measurement control signal.

5. The memory device of claim 2, wherein the frequency divider comprises:
    a NAND gate receiving the first measurement control signal and an inverted output signal of a flip-flop;
    an inverter receiving an output signal of the NAND gate; and
    the flip-flop resetting when the locking completion signal is disabled, receiving the output signal of the inverter in response to the second internal clock signal and outputting the frequency divided clock signal.

6. The memory device of claim 2, wherein the control clock generator comprises:
a first NAND gate receiving the external clock signal and the second measurement control signal;
a delay receiving, inverting and delaying an output signal of the first NAND gate; and
a second NAND gate receiving an output signal of the delay and the measurement stop signal and generating the control clock signal.

7. The memory device of claim 2, wherein the measurement signal generator comprises:
a plurality of flip-flops connected in series and receiving the frequency divided clock signal in response to the control clock signal; and
NAND gates respectively generating measurement signals in response to the output signals or inverted output signals of the plurality of flip-flops and neighboring measurement signals,
wherein the inverted output signal of the last flip-flop of the serially connected flip-flops becomes the measurement stop signal.

8. The memory device of claim 1, wherein the DLL comprises:
a phase detector comparing a phase of the external clock signal to a phase of the second internal clock signal and generating a phase control signal; and
a delay delaying the first internal clock signal in response to the phase control signal to generate the second internal clock signal.

9. The memory device of claim 1, wherein the latency counter comprises:
a logic circuit combining the measurement signals and latency information of the memory device to generate a plurality of switch signals;
a plurality of flip-flops connected in series and sequentially receiving the external read command signal in response to the external clock signal; and
a switching unit selecting the external read command signal or output signals of the flip-flops in response to the switch signals and transferring the selected signal as the latency signal.

10. A memory device comprising:
a command buffer receiving an external command and outputting a first command signal;
a clock buffer receiving an external clock signal and generating a first internal clock signal;
a delay measurement unit generating a second internal clock signal and measurement signals in response to the first internal clock signal and a fourth internal clock signal in order to measure a delay time between when the external clock signal is input and when read data is output;
a DLL receiving the second internal clock signal and generating a third internal clock signal and the fourth internal clock signal synchronized with the first internal clock signal;
a latency counter generating a second command signal from the first command signal in response to the first internal clock signal and the measurement signals;
a delay cell replica delaying the second command signal by a delay time from the second internal clock signal to the third internal clock signal to generate a latency signal; and
a data output buffer outputting the read data in response to the latency signal and the third internal clock signal,
wherein the delay measurement unit generates the second internal clock signal having a one-cycle-missed period in response to a locking completion signal representing a time when locking of the DLL is finished.

11. The memory device of claim 10, wherein the delay measurement unit comprises:
a measurement start signal generator generating a measurement start signal in response to the locking completion signal and the first internal clock signal, and generating the second internal clock signal in response to the measurement start signal and the first internal clock signal;
a measurement control signal generator generating first and second measurement control signals in response to the first internal clock signal and the locking completion signal;
a frequency divider dividing a frequency of the first internal clock signal in response to the first measurement control signal to generate a frequency divided clock signal;
a control clock generator generating a control clock signal in response to the second measurement control signal and the first internal clock signal; and
a measurement signal generator generating the measurement signals and a measurement stop signal in response to the control clock signal and the frequency divided clock signal.

12. The memory device of claim 11, wherein the measurement start signal generator comprises:
a first flip-flop receiving the locking completion signal in response to the first internal clock signal and outputting a first node signal;
a first inverter receiving the first internal clock signal;
a first NAND gate receiving the first node signal, a third node signal and the measurement start signal;
a second inverter receiving an output signal of the first NAND gate and outputting a second node signal;
a second flip-flop receiving the second node signal in response to an output signal of the first inverter and outputting the measurement start signal;
a delay delaying and inverting the measurement start signal;
a second NAND gate receiving the measurement start signal and an output signal of the delay;
a third NAND gate receiving an output signal of the second NAND gate and an output signal of a fourth NAND gate;
the fourth NAND gate receiving an output signal of the third NAND gate and the first internal clock signal;
a third inverter receiving the output signal of the third NAND gate and generating the third node signal;
a latency counter replica receiving the first internal clock signal and delaying the external clock signal by a delay time of the latency counter; and
an AND gate receiving an output signal of the latency counter replica and the measurement start signal and outputting the second internal clock signal.

13. The memory device of claim 12, wherein the measurement control signal generator comprises:
a third flip-flop receiving the first node signal in response to the first internal clock signal;
a second delay receiving an output signal of the third flip-flop and outputting the first measurement control signal;
a fourth inverter receiving the first internal clock signal; and
a fourth flip-flop receiving the output signal of the third flip-flop in response to an output signal of the fourth inverter and outputting the second measurement control signal.

14. The memory device of claim 11, wherein the frequency divider comprises:
a NAND gate receiving the first measurement control signal and an inverted output signal of a flip-flop;
an inverter receiving an output signal of the NAND gate; and
the flip-flop resetting when the locking completion signal is disabled, receiving an output signal of the inverter in response to the fourth internal clock signal and outputting the frequency divided clock signal.

15. The memory device of claim 11, wherein the control clock generator comprises:
a first NAND gate receiving the first internal clock signal and the second measurement control signal;
a delay receiving, inverting and delaying an output signal of the first NAND gate; and
a second NAND gate receiving an output signal of the delay and the measurement stop signal and generating the control clock signal.

16. The memory device of claim 11, wherein the measurement signal generator comprises:
a plurality of flip-flops connected in series and receiving the frequency divided clock signal in response to the control clock signal; and
NAND gates respectively generating measurement signals in response to the output signals or inverted output signals of the plurality of flip-flops and neighboring measurement signals,
wherein the inverted output signal of the last flip-flop of the serially connected flip-flops becomes the measurement stop signal.

17. The memory device of claim 10, wherein the DLL comprises:
a phase detector comparing a phase of the external clock signal to a phase of the second internal clock signal and generating a phase control signal;
a delay cell delaying the second internal clock signal in response to the phase control signal to generate the third internal clock signal;
a data output buffer replica receiving the third internal clock signal and delaying the third internal clock signal by a delay time of the data output buffer; and
a clock buffer replica delaying an output signal of the data output buffer replica by a delay time of the clock buffer.

18. The memory device of claim 17, wherein the delay cell comprises:
a first variable delay varying a delay time of the second internal clock signal in response to the phase control signal; and
a first fixed delay delaying the second internal clock signal that has passed through the first variable delay by a fixed delay time to generate the third internal clock signal.

19. The memory device of claim 18, wherein the delay cell replica comprises:
a second variable delay varying a delay time of the second command signal in response to the phase control signal; and
a second fixed delay delaying the second command signal that has passed through the second delay by a fixed delay time to generate the latency signal.

20. The memory device of claim 19, wherein the second variable delay has the same configuration as the first variable delay.

21. The memory device of claim 19, wherein the second fixed delay has the same configuration as the first fixed delay.

22. The memory device of claim 10, wherein the latency counter comprises:
a logic circuit combining the measurement signals and latency information of the memory device to generate a plurality of switch signals;
a plurality of flip-flops connected in series and sequentially receiving the external read command signal in response to the external clock signal; and
a switching unit selecting the external read command signal or output signals of the flip-flops in response to the switch signals and transferring the selected signal as the second command signal.

23. A method of operating a memory device, comprising:
receiving an external clock signal and an external read command;
generating an internal clock signal from an external clock signal input to a DLL, the internal clock signal missing one clock cycle;
generating measurement signals using the internal clock signal that misses one clock cycle in order to measure a delay time from when the external clock signal is input until when data read from a memory array is output;
generating a latency signal from the external read command signal in response to the measurement signals; and
outputting the read data in response to the latency signal and the internal clock signal.

24. The method of claim 23, wherein the internal clock signal leads the external clock signal by a delay time from when the internal clock signal is generated until when the read data is output.

25. The method of claim 23, wherein the generating of the measurement signals comprise:
generating a measurement start signal having a logic low period corresponding to one clock cycle in response to a locking completion signal representing a time when locking of the DLL is finished;
generating the internal clock signal in response to the external clock signal and the measurement start signal;
dividing a frequency of the internal clock signal to generate a frequency divided clock signal; and
sampling the frequency divided clock signal in response to the internal clock signal and generating the measurement signals.

26. The method of claim 23, wherein the generating of the latency signal comprises:
combining the external read command signal with latency information of the memory device to generate a plurality of switch signals;
inputting the external read command signal to a shift register including a plurality of flip-flops connected in series; and
outputting output signals of the flip-flops, which correspond to the switch signals, as a latency signal in response to the external clock signal.

27. The method of claim 26, wherein the latency signal is enabled after a lapse of a number of clock cycles, which is smaller than a CAS latency of the memory device by 1, in order to generate a data strobe signal of the memory device.

28. The method of claim 27, wherein the latency signal is enabled during a period in which data corresponding to a burst length of the memory device is output.

* * * * *